(12) United States Patent
Zhong et al.

(10) Patent No.: US 7,483,732 B2
(45) Date of Patent: Jan. 27, 2009

(54) MAGNETIC RESONANCE IMAGING OF A MEDICAL DEVICE AND PROXIMATE BODY TISSUE

(75) Inventors: Sheng-Ping Zhong, Shrewsbury, MA (US); Michael N Helmus, Worcester, MA (US); Scott R. Smith, Chaska, MN (US); Bruce E. Hammer, Minnetonka, MN (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 574 days.

(21) Appl. No.: 10/826,960

(22) Filed: Apr. 15, 2004

(65) Prior Publication Data

US 2005/0240098 A1   Oct. 27, 2005

(51) Int. Cl.
*A61B 5/05* (2006.01)
*G01V 3/00* (2006.01)

(52) U.S. Cl. .................. 600/423; 324/309; 600/420; 600/424

(58) Field of Classification Search .......... 600/411, 600/420, 423, 433; 424/9.3, 9.323, 9.37, 424/9.42
See application file for complete search history.

(56) References Cited

U.S. PATENT DOCUMENTS

| | | | |
|---|---|---|---|
| 4,639,364 A | 1/1987 | Hoey | 424/9 |
| 4,713,722 A * | 12/1987 | Toyoda et al. | 361/141 |
| 4,985,233 A | 1/1991 | Klaveness et al. | |
| 5,068,098 A * | 11/1991 | Schweighardt et al. | 424/9.37 |
| 5,154,179 A | 10/1992 | Ratner | 128/653.4 |
| 5,196,348 A | 3/1993 | Schweighardt et al. | 436/173 |
| 5,352,431 A | 10/1994 | Hashiguchi et al. | |
| 5,362,478 A | 11/1994 | Desai et al. | |

(Continued)

FOREIGN PATENT DOCUMENTS

WO        WO 98/22022        5/1998
WO   WO 03/98232 11/2003        11/2003

OTHER PUBLICATIONS

Ehnholm et al., "Instrument Tracking System Using Fluor Markers," *Proc. Intl. Soc. Mag. Reson. Med.*, 2003, 11:2545.

(Continued)

*Primary Examiner*—Eric F Winakur
*Assistant Examiner*—Michael T Rozanski
(74) *Attorney, Agent, or Firm*—Crompton, Seager & Tufte, LLC (57) ABSTRACT

Medical devices incorporate therein imaging materials having selected MRI detectable nuclei to provide useful magnetic resonance images of the medical devices and proximate body tissue. Also, a method generates MRI images of such a medical device, and involves performing first and second MRI processes on a body portion including at least a portion of the medical device to obtain, respectively, first and second image data. The first MRI process is adapted to detect MRI detectable nuclei present in the proximate body tissue, and the second MRI process is adapted to detect the selected MRI detectable nuclei contained in the device's imaging material. The selected MRI detectable nuclei incorporated in the imaging material is not the same nuclei that the first MRI process is adapted to detect. The second image data are combined with the first image data to produce image data for the medical device and the proximate body tissue.

49 Claims, 4 Drawing Sheets

U.S. PATENT DOCUMENTS

| | | | |
|---|---|---|---|
| 5,576,072 | A | 11/1996 | Hostettler et al. ............ 427/532 |
| 5,662,960 | A | 9/1997 | Hostettler et al. ............ 427/2.3 |
| 5,728,079 | A | 3/1998 | Weber et al. |
| 5,744,958 | A | 4/1998 | Werne |
| 5,817,017 | A | 10/1998 | Young et al. |
| 6,207,134 | B1 | 3/2001 | Fahlvik et al. |
| 6,280,385 | B1 | 8/2001 | Melzer et al. |
| 6,317,091 | B1 | 11/2001 | Oppelt |
| 6,361,759 | B1 | 3/2002 | Frayne et al. |
| 6,368,574 | B1 | 4/2002 | Akeson et al. |
| 6,463,317 | B1 | 10/2002 | Kucharczyk et al. |
| 6,574,497 | B1 | 6/2003 | Pacetti |
| 6,975,896 | B2 * | 12/2005 | Ehnholm et al. ............ 600/414 |
| 2002/0101241 | A1 * | 8/2002 | Chui ......................... 324/319 |
| 2002/0183763 | A1 | 12/2002 | Callol et al. |
| 2003/0078492 | A1 | 4/2003 | Talpade |

OTHER PUBLICATIONS

Glowinski, "Field Inhomogeneity-Based Catheter Visualization," *Interventional Magnetic Resonance Imaging*, 1998, Chapter 7, pp. 57-63.

Kozerke et al., "Catheter Tracking and Visualization using $^{19}$F Nuclear Magnetic Resonance," *Mag. Reson. Med.*, 2004, 52:693-697.

Smits and Bakker, "Susceptibility-Based Cather Visualization," *Interventional Magnetic Resonance Imaging*, 1998, Chapter 6, pp. 51-55.

"Sonochemically Produced Fluorocarbon Microspheres: A New Class of magnetic Resonance Imaging Agent", by Andrew G. Webb et al., *JMRI* 1996, pp. 675-683.

"H Decoupling for an In Vivo $^{19}$F MRS Studies Using the Time-Share Modulation method on a Clinical 1.5 T NMR System" by Belinda S.Y. Li et al., *Magnetic Resonance in Medicine*, vol. 44, 2000, pp. 5-9.

"$^{19}$F-MRI of Perfluorononane as a Novel Contrast Modality for Gastroinestinal Imaging" by Roman Schwarz et al., *Magnetic Resonance in Medicine*, vol. 41, 1999, pp. 80-86.

"Catheter-Based Endomyocardial Injection With Real-Time Magnetic Resonance Imaging", by Robert J. Lederman et al., *Circulation*,, Mar. 19, 2002, pp. 1282-1284.

"Fluorine NMR" by J.T. Gerig et al., 2001, pp. 1-35.

"Catheter-Tracking FOB MR Fluoroscopy" by Ergin Atalar et al., *Magnetic Resonance in Medicine*, 1998, pp. 865-872.

"Real-Time MR Imaging-guided Passive Catheter Tracking with Use of Gadolinium-filled Catheters[1]", by Reed A. Omary et al., *JVIR*, Sep. 2000, pp. 1079-1085.

"Active MR Visualization of a Vascular Guidewire In Vivo", by Mark E. Ladd et al., *JMRI*, vol. 8, No. 1, 1998, pp. 220-225.

"Perfluorocarbon compounds: applications in diagnostic imaging" by Robert F. Mattrey, *Proceedings of SPIE-The International Society for Optical Engineering*, vol. 626, Feb. 1986, pp. 18-23.

"Perfluorochemicals as US Contrast Agents for Tumor Imaging and Hepatosplenography: Preliminary Clinical Results[1]" by Robert F. Mattrey et al., *Radiology*, 1987, pp. 339-343.

"In Vivo MR Measurements of Regional Arterial and Venous Blood Volume Fractions in Intact Rat Brain", by Timothy Q. Duong et al., *Magnetic Resonance in Medicine*, vol. 43, 2000, pp. 393-402.

"Chemical-shift MR Imaging of Acetic Acid during percutaneous Chemical Ablation Therapy: Preliminary Work", by David A. Roberts et al., *SIR*, vol. 13, No. 10, Oct. 2002, pp. 1055-1059.

Multiexponential Electronic Spin Relaxation and Redfield's Limit in Gd(III) Complexes in Solution: Consequences for $^{17}$O/$^{1}$H NMR and EPR Simultaneous Analysis, by Alain Borel et al., *JACS Articles*, vol. 124, No. 2, 2002,. pp. 2042-2048.

* cited by examiner

MAGNETIC RESONANCE IMAGING OF A MEDICAL DEVICE AND PROXIMATE BODY TISSUE

TECHNICAL FIELD

The invention relates to techniques for generating a magnetic resonance image of a body implantable or insertable medical device and body tissue that is proximate to the implanted or inserted medical device. In addition, the invention relates to various medical devices that incorporate an imaging material so that a magnetic resonance image of the devices and proximate body tissue may be generated.

BACKGROUND

Magnetic resonance imaging (MRI) is a non-invasive medical procedure that utilizes magnets and radio waves to produce an image of the inside of a body. An MRI machine, or scanner, is capable of producing images of a body with excellent tissue contrast and without exposing the body to ionizing radiation (X-rays). In addition, MRI scans can see through bone and provide detailed images of soft body tissue.

A typical MRI machine includes a magnet that is utilized to create a strong homogenous magnetic field. A patient is placed into, or proximate, the magnet. The strong magnetic field causes atoms within the patient's body to align. A radio wave is directed at the patient's body, triggering atoms within the patient's body to emit radio waves of their own. These return radio waves create signals (resonant signals) that are detected by the MRI machine at numerous angles around the patient's body. The signals are sent to a computer that processes the information and compiles an image, or images. Typically, although not necessarily, an image is in the form of two-dimensional "slice" images.

Many medical procedures involve inserting medical devices (for example, catheters, guidewires, stents and drug delivery devices) into the body of a patient. Traditionally, X-ray fluoroscopy has been used for guidance of medical devices during intervention procedures, but this method has its drawbacks. MRI techniques are beginning to be used and investigated for obtaining an image of the medical device and body tissue that is proximate to the device. As a medical device is advanced through the body during an intervention procedure, its progress may be tracked so that the device can be delivered properly to a target site. Once delivered to the target site, the device can be monitored to determine whether it has been placed properly and/or is functioning properly.

In the case of obtaining an MRI image of body tissue, an $^1$H MRI process is well suited. In the case of $^1$H MRI, the detectable species are protons (hydrogen nuclei). Most implantable or insertable medical devices are made of materials such as organic polymers, metals, ceramics, or composites thereof, which do not produce adequate signals for detection by an $^1$H MRI process. As such, a negative location on an MRI image may be used to indicate the location of the medical device. In such a case, the medical device is often difficult to see in an $^1$H MRI image, because it fails to produce sufficient contrast with respect to the surrounding body tissue or structures, and/or is too small to be readily detected.

The ability to identify the medical device in an $^1$H MRI image may be enhanced, passively, by incorporating paramagnetic or ferromagnetic contrast mediums into the device. Paramagnetic and ferromagnetic contrast mediums provide contrast between the medical device and the body tissue by altering the relaxation time of the MRI signal in the tissue near the agent. Another approach is an active approach that incorporates a coil onto the medical device and run a direct current (DC) through the coil. The current creates an adjustable inhomogeneity in the magnetic field that produces an artifact that indicates in an image the position of the medical device in the tissue. Another active approach is to incorporate a small radio frequency (RF) coil in the device. Activation of the RF coil enables the position of the coil to be shown in the MRI image.

Another type of MRI process is fluorine MRI where the detectable species are fluorine nuclei ($^{19}$F). Fluorine MRI has been used in many different applications. For example, fluorine MRI enables the measurement of local oxygen pressure in body tissue because of the high soluability of oxygen in fluorocarbons, and so blood flow and vascular volume, for example, may be measured using a $^{19}$F MRI process. Other applications of $^{19}$F have been, for example, examining the biodistribution of fluorinated anesthetics and drugs.

So called "real time" MRI techniques are being developed as an alternative to X-ray tracking for tracking the location of an inserted or implantable device in an intervention procedure. In one such procedure, two images are obtained: 1) a tissue road map image is obtained using an external $^1$H MRI process; and 2) an $^1$H MRI field of view image is obtained using an MR catheter probe. The second image is displayed on the road map image. Other real-time MRI procedures use a single $^1$H MRI process, and rely on, for example, the use of a contrast agent so that the position of the medical device may be discerned in the $^1$H MRI image.

An MRI process that uses both $^1$H and $^{19}$F excitation has been used to perform in vivo $^{19}$F [$^1$H] decoupling so that the presence of $^{19}$F nuclei susceptible to coupling with neighboring protons may be determined with better signal intensity and spectral resolution. This process may be performed using a time-sharing modulation method where $^1$H decoupling RF excitation pulses are generated after $^{19}$F RF excitation pulses and interleaved between successive sampling points where free induction decay following the $^{19}$F pulses is sampled.

SUMMARY

Generally, the invention provides body-implantable, or body-insertable, medical devices that incorporate an imaging material therein that enables the medical devices to be more easily detected within a magnetic resonance image of the medical devices and proximate body tissue. Also generally, the invention provides techniques for capturing a magnetic resonance image of such a medical device and proximate body tissue, using a first MRI process adapted to detect nuclei present in the body tissue and a second MRI process adapted to detect different nuclei incorporated into the medical device.

In one aspect, the invention provides a method of generating an MRI image of a medical device and proximate body tissue in which the device is located. With the method, the medical device has incorporated therein an imaging material comprising selected MRI detectable nuclei. The method involves performing a first MRI process on a body portion including at least a portion of the medical device to obtain first image data. This first MRI process is adapted to detect MRI detectable nuclei present in the proximate body tissue. The method also involves performing a second MRI process on the body portion to obtain second image data. This second MRI process is adapted to detect the selected MRI detectable nuclei contained in the medical device imaging material. The selected MRI detectable nuclei incorporated in the imaging material is not the same nuclei that the first MRI process is adapted to detect. The process further involves combining the second image data with the first image data to produce combined image data for the medical device and the proximate body tissue. The combined image data indicates the relative position of the medical device within the proximate body tissue.

In various implementations, the invention may include one or more of the following features. The first MRI process may be, for example, a hydrogen nuclei MRI process, a phosphor nuclei MRI process, a potassium nuclei MRI process, or a sodium nuclei MRI process. Generally, the imaging material incorporated into the medical device may be, for example, fluorine, phosphorus, hydrogen, sodium, and tritium. As such, the second MRI process, may be, for example, a fluorine nuclei MRI process and the imaging material incorporated into the medical device includes fluorine nuclei. Alternatively, the second MRI process may be a phosphate nuclei MRI process and the imaging material incorporated into the medical device includes phosphate nuclei. In another alternative, the second MRI process may be an iodine nuclei MRI process and the imaging material incorporated into the medical device includes iodine nuclei. The second MRI process may also be an iodine nuclei MRI process and the imaging material incorporated into the medical device includes iodine nuclei.

In one implementation, the first MRI process may use a first frequency of transmitted RF excitation pulses that is different from a second frequency of transmitted RF excitation pulses used in the second MRI process. In another implementation, the first MRI process and the second MRI process use the same frequency for transmitted RF excitation pulses, and the first MRI process uses a first magnetic field strength that is different from a second magnetic field strength used in the second MRI process.

The first and second MRI processes may be performed during a common time period using a time-sharing technique that interleaves transmitted MRI excitation pulses used in each of the first and second MRI processes. Alternatively, the first and second MRI processes may be performed at different times. In one implementation, multiple, successive samples of the combined image data are generated during the course of an intervention procedure. In this case, the method further comprising generating on a display device multiple, successive images of the multiple, successive samples of the combined image data as the combined image data samples are being generated.

The medical devices to which the invention applies include, for example, catheters, grafts, implants, needles, and guide wires. Examples of applicable catheters include guide catheters, balloon catheters, tumor ablation catheters, aneurysm catheters, urology catheters, and perfusion catheters. Examples of grafts include vascular grafts and stent grafts. Examples of implants include a bulking agent.

In one implementation, the imaging material is in the form of a liquid, for example, a neat liquid, a solution, or an emulsion. The liquid may be encapsulated in, for example, a microsphere, a lumen, a hollow fiber, a microporous material (comprising, for example, a film or a foam), a channel, or a cavity. In one example, the microporous film in which the liquid imaging material is incorporated may comprise a polymer, such as polytetrafluoroethylene, polypropylene, polyethylene, polyurethane, EPDM rubbers, SIBS, polyamides, and combinations thereof.

In another implementation, imaging material is included in a structural material. The medical device may have a coating that includes the imaging material. Examples of coatings are polymers, for example, polyethylene oxide, polypropylene oxide, polyvinyl-pyrrolidone, polyurethane-polyurea, poly-carboxylic acid, cellulosic polymers, gelatin, maleic anhydride polymers, polyamides, polysaccharides, polyvinyl alcohol, polyacrylic acid, and combinations thereof. In another implementations, the imaging material may include a spin ½ nucleus, or may include at least two spin ½ nuclei that are magnetically equivalent.

Where the imaging material includes fluorine nuclei, the imaging material may be a perfluorinated compound. Examples of such compounds include perfluoroalkanes, perfluoroalkylamines, perfluoro-crown-ethers (for example, perfluoro-[15]-crown-5-ether), perfluorinatedz alcohols, perfluorohaloalkanes, perfluorinated carboxylic acids, perfluorinated acrylates, and perfluorinated esters. Examples of perfluoroalkane include perfluorodecalin, perfluorononane, and combinations thereof. Further examples of fluorine nuclei containing imaging materials include 4-fluoro-dl-glutamic acid and fluorinate alginate.

In other implementations, the imaging material may be a hydrogen-containing compound selected from the group consisting of acetic acid. The medical device may further include a relaxation agent that decreases the spin-lattice relaxation time of the selected MRI detectable nuclei contained in the medical device imaging material. The medical device may further include a receiver coil that provides magnetic resonance imaging enhancement.

In another aspect, the invention provides a medical device adapted for insertion into body tissue. The medical device includes an MRI detectable material having a spin ½ nucleus with a resonance frequency that is distinct from the resonance frequency of hydrogen nuclei found in the body tissue.

In yet another aspect, the invention provides a medical device adapted for insertion into body tissue. The medical device includes an MRI detectable material having a spin ½ nucleus with a resonance frequency that is distinct from the resonance frequency of hydrogen nuclei of the body tissue. In addition, the medical device has a microporous film and a fluorinated compound. The fluorinated compound resides in the pores of the microporous film.

In various implementation of this medical device, the fluorinated compound may be, for example, perfluorodecalin or perfluoro-[15]-crown-5-ether.

In another aspect, the invention provides a medical device adapted for insertion into body tissue. The medical device comprises an MRI detectable material having a spin ½ nucleus with a resonance frequency that is distinct from the resonance frequency of hydrogen nuclei found in the body tissue. The medical has a coating that includes fluorinate alginate.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
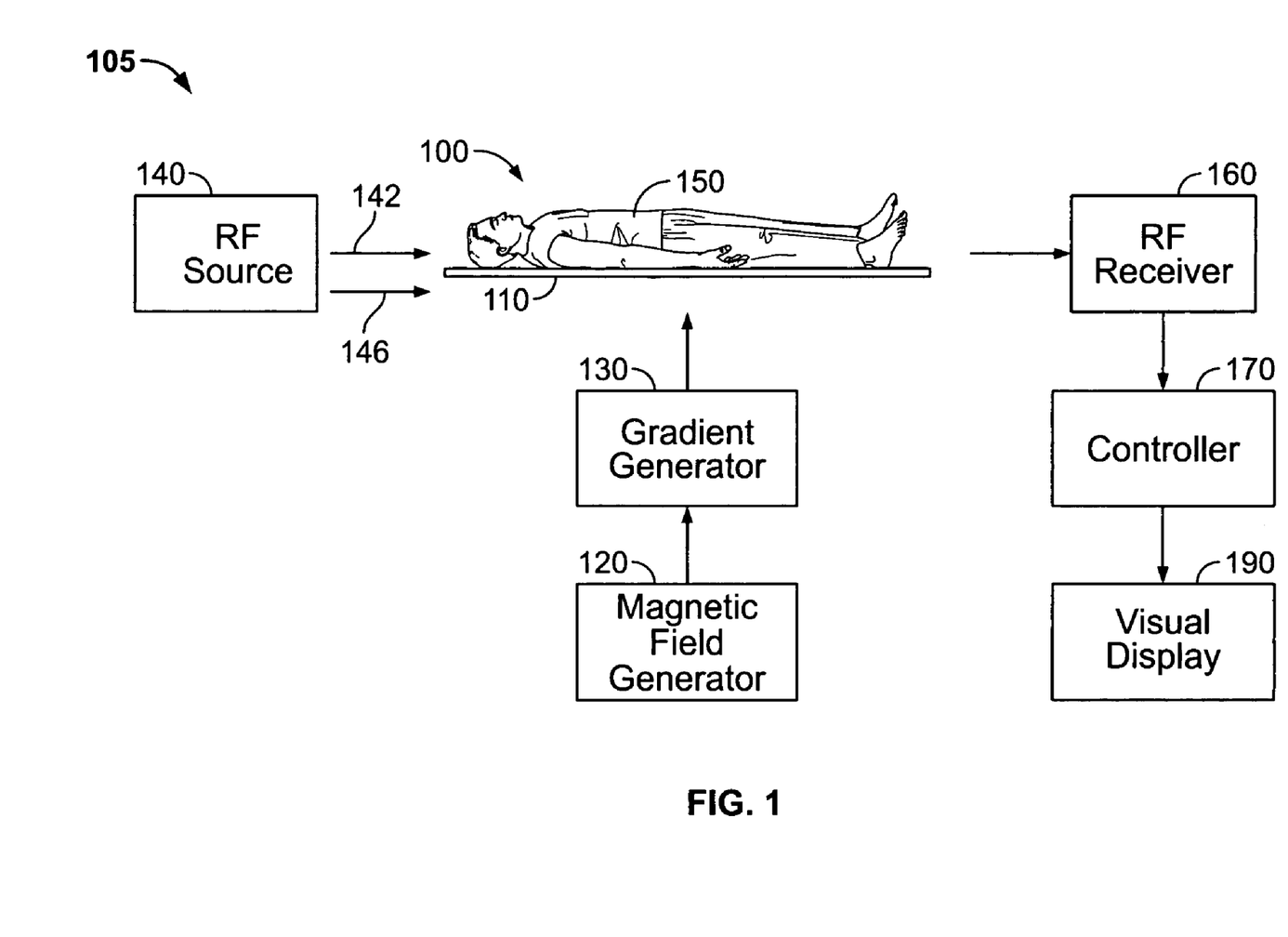
FIG. 1 is a partial block diagram of a magnetic resonance imaging system with a patient positioned therein.

FIG. 1 is a diagram showing a patient 100 positioned within a magnetic resonance imaging (MRI) machine 105, shown in partial block format. The patient 100 is lying on a support table 110 and is positioned in a homogeneous magnetic field generated by a magnetic field generator 120. The magnetic field generator 120 typically consists of a cylindrical magnet adapted to receive the patient 100. A magnetic field gradient generator 130 creates magnetic field gradients of predetermined strength in three mutually exclusive orthogonal directions at predetermined times. The magnetic field gradient generator 130 typically consists of a set of cylindrical coils concentrically positioned within the magnetic field generator 120.

The patient 100 is shown having an implanted medical device 150, which in this example is a stent. A region of the patient 100 in which the medical device 150 is implanted is positioned in the approximate center of the bore of the magnetic field generator 120. The medical device 150 has incorporated therein an imaging material. The imaging material has selected nuclei that may be detected in an MRI process. The imaging material may be, for example, iodine, fluorine, fluorinated compounds, fluoro-polymers, fluoro-microspheres, or phosphate. These materials can be present in the device 150 on its surface, in its bulk matrix, in a channel or lumen or cavities of the device 150. The incorporation of such imaging material in the medical device 150 enables the device 150 to be easily detected in an MRI image, as described in more detail below. Detail of various useful imaging materials, as well how the imaging materials may be incorporated into various medical devices, is described later in this specification.

The MRI machine 105 also has a radio frequency (RF) source 140 that radiates pulsed RF energy into the patient 100 and the device 150 therein. The radiation of the RF energy is done to influence nuclear magnetic spins in a fashion well known to those skilled in the art. In one example, the RF source 140 is capable of generating at least two RF signals 142 and 146 that have different frequencies. The first signal 142 is of a frequency selected to excite nuclear spins present in the patient's body tissue, for example, hydrogen nuclei. The second signal 146 is of a frequency selected to excite nuclear spins present in the imaging material incorporated into the medical device 150, for example, fluorine nuclei. In an alternative implementation, instead of using multiple RF frequencies to excite the different nuclei, a single RF frequency may be used. In this implementation, different magnetic field strengths can be used to excite the two different nuclei. For example, one field strength is used to excite hydrogen nuclei to produce an image of body tissue, whereas another field strength is used to excite the nuclei in the medical device's imaging material.

The radiation of multiple RF frequencies may be achieved with a single multiple-frequency, or broadband, RF source, that may be programmed to generate RF signals at a selected frequency. Alternatively, the radiation of multiple RF frequencies may be achieved with multiple single-frequency RF sources. In addition, there are a variety of different RF source types used in different MRI machines. By way of example, the RF source 140 may have a cylindrical external coil that surrounds the region of interest of the patient 100. Such an external coil can have a diameter sufficient to encompass the entire patient 100. Other geometries, such as smaller cylinders specifically designed for imaging the head or an extremity of a patient may also be used. In addition, RF coils that are not cylindrical, such as surface coils, may be used.

The influence of the first RF signal 142 on the atoms of the body tissue causes them to resonate at a first Larmor frequency, whereas the influence of the second RF signal 146 on the atoms of the imaging material in the device 150 causes them to resonate at a second Larmor frequency. The Larmor frequency for a magnetically active nucleus is proportional to its gyromagnetic ratio and the strength of the magnetic field. For example, in a magnetic field of 1.5 Tesla, which is commonly employed in standard MRI imaging systems, hydrogen nuclei ($^1$H), which are abundant in body tissue, resonate at a Larmor frequency of 63.87 MHz. Where the medical device 150 incorporates, for example, a fluorinated imaging material, the fluorine nuclei ($^{19}$F) would resonate at a Larmor frequency of 60.12 MHz in a 1.5 Tesla field.

Next, the MRI machine 105 includes an external RF receiver 160 that detects the RF signals emitted by the patient 100 and those emitted by the implanted device 150 in response to the RF signals generated by RF source 140. In one example, the external RF receiver 160 is a cylindrical external coil that surrounds the region of interest of subject 100. Such an external coil can have a diameter sufficient to encompass the entire patient 100. Other geometries, such as smaller cylinders specifically designed for imaging the head or an extremity can be used instead. Non-cylindrical external coils, such as surface coils, may alternatively be used. The external RF receiver 160 can share some or all of its structure with the RF source 140, or can have a structure entirely independent of the RF source 140. The region of sensitivity of the RF receiver 160 is larger than that of the medical device 150 and can encompass the entire patient 100 or a specific region of the patient 100.

A controller unit 170 receives and processes the emitted RF signals detected by the RF receiver 160. The controller unit 170 analyzes the received RF signals to generate an image that may be displayed on a display device 190. The controller unit 170 may also control the magnetic field gradient generator 120 and the RF source 140.

In operation, the MRI machine 105 may be used to produce a two- or three-dimensional (2-D or 3-D) image of the patient 100 (or a selected portion of the patient) and the medical device 150 that is within the patient 100. A scan of the patient 100 may begin when the body part to be scanned is positioned in the center of the MRI machine 105, as is shown in FIG. 1. The MRI machine 105, as is well known, is able to direct RF pulses at selected volume locations within the patient 100. The MRI machine 105 proceeds successively through multiple volume locations within the patient's body and builds a 2-D or 3-D image map. More particularly, the MRI machine 105 produces two such image maps: 1) a first image map that is produced using the first signal 142 having a frequency selected to influence nuclear magnetic spins in the body tissue, and 2) a second image map which is produced using the second RF signal 146 having a frequency selected to influence nuclear magnetic spins in the imaging material incorporated into the medical device 150. The image of body tissue may be generated so as to serve as a "roadmap" for an intervention, and the image of the medical device 150 may be combined with the roadmap image to produce a combined image of both with good contrast. Different colors may be used to the two images to provide even better contrast between the medical device and the body tissue.

During the course of an intervention procedure where the medical device 150 may be changing locations within the patient 100, a single tissue roadmap image may be generated, followed by the generation of multiple successive images of the device 150. Each successive image of the device may be combined and displayed with the same body tissue roadmap image. This may aid the physician in the intervention procedure by providing a real-time image of the procedure as it progresses. In addition, the fact that additional images of the tissue roadmap image need not be acquired for each device image that is acquired may increase the refresh time of the combined image—that is, successive images showing new positions of the medical device 150 during a procedure may be produced more rapidly. In other examples, the tissue roadmap image may be periodically generated, or updated, during the invention procedure, but fewer times than the device image is generated, or updated.

When imaging a specimen for both $^1$H and $^{19}$F, one approach is to alternate between $^{19}$F and $^1$H images. In this case, $^1$H of $^{19}$F are selectively excited by delivery of narrow band RF pulses. Typical excitation pulse bandwidth is <100 KHz. Since only one material is excited, any signal subsequently measured (except for noise) must come from that material. For optimum imaging signal-to-noise ratio, it is common to tune both the transmit and receive coils to resonate at the Larmor frequency, thus maximizing Q for the system. It is not uncommon for a single coil to both transmit and receive. In one embodiment, separate coils are used for $^{19}$F and $^1$H imaging. These coils could be placed one inside the other, or they can be overlapping loops. It is desirable for the coils to have substantially overlapping fields of view as determined by their sensitivity maps. Alternatively, a single coil can be tuned to be dual resonant at both $^1$H and $^{19}$F Larmor frequencies. While more complicated, this has been demonstrated to be effective. One drawback of interleaved imaging methods is that it can be slower due to the additional steps involved. For real-time imaging of interventional procedures, this may be a significant drawback in some cases depending on the application. For example, if a Spin echo sequence with a matrix of 128×128 and a TR of 20 ms is performed, one image can be acquired every 2.5 seconds (128×20=2560 ms). If the $^1$H and $^{19}$F sequences were simply alternated, this would require more than 5 sec to acquire a single composite image.

Several other strategies are available for accelerating the imaging. One is to take advantage of the different Larmor frequencies and the significant dead time in the sequence to interleave the sequences. A basic MR acquisition sequence consists of a transmitted RF pulse of approximately 3 microseconds, followed by a series of samples collected from 5-100 ms later. A refocusing pulse is often delivered midway between the transmit and read points. This refocusing pulse results in a more intense "echo" coinciding with the sampling point (TE). The intervening time can be used to collect other acquisitions provided they are at different frequencies and the echoes are measured at different times. In this way, the $^1$H and $^{19}$F sequences can be interleaved without any significant additional time. These techniques may be useful for relatively slow or intermittent procedures such as percutaneous biopsy.

Relatively slow sequences may be too slow to guide many real-time procedures such as catheterizations. These procedures often rely on faster "steady state" imaging techniques such as fast imaging with stead-state precession (FISP) that have a TR as short as 3 ms. In this case, there is virtually no dead time in which to interleave sequences, so some other acceleration strategy is required. It is possible to perform $^{19}$F and $^1$H imaging simultaneously by using filters to separate the signals. This approach requires very narrow filters that may degrade the signal intensity. Furthermore, it has been shown that $^{19}$F can transfer magnetization to $^1$H, thereby further confusing the signals. Approaches to address these issues are known, for example, as described by Li et al., "$^1$H Decoupling for In Vivo $^{19}$F MRS Studies Using the Time-Share Modulation Method on a Clinical 1.5 T NMR System," in *Magnetic Resonance in Imaging*, Vol. 44, 2000, pp. 5-9.

Another approach to decrease image acquisition time is to use local imaging coils on the device to spatially select the $F^{19}$ signal by virtue of its limited spatial sensitivity. This would improve the definition of the representation of the device on the composite image. Another technique would be to apply the $^{19}$F excitation on alternate acquisitions in K-space. This could enhance the differentiation of the $^{19}$F and $^1$H signals provided either spatial encoding or other technique were used to correct aliasing. The spatial encoding could derive from the sensitivity of external or internal coils. Alternatively, sensitivity encoding could be obtained from $^{19}$F and $^1$H tuned coils.

Figure 2:
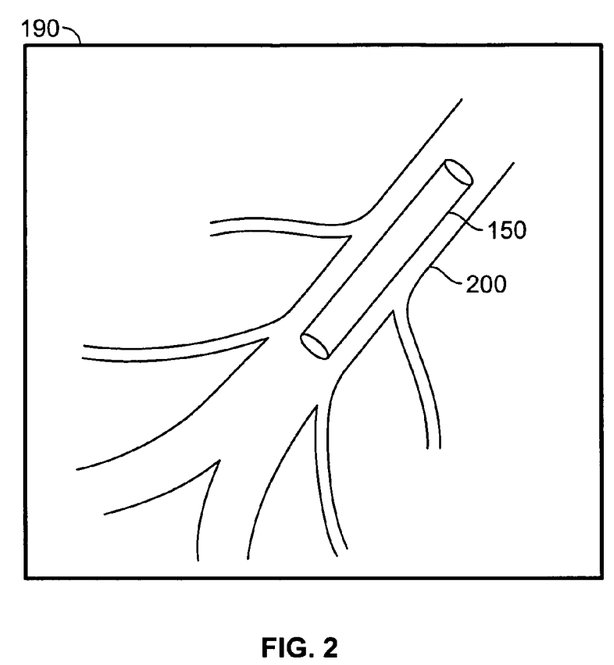
FIG. 2 is an image of a medical device within a blood vessel that may be acquired using the system shown in FIG. 1.

FIG. 2 shows an example image displayed on the display device 190 of the MRI machine 105 shown in FIG. 1. The displayed image includes both an image of body tissue 200 (in this example, a blood vessel) and an image of a medical device 150 (in this case a stent) that is located in the blood vessel. Although the example medical device 150 shown in FIGS. 1 and 2 is a stent, it will be understood that the disclosed imaging materials may be incorporated in any of a number of different medical devices so as to achieve images of such devices within body tissue. Some examples of such other medical devices are catheters, grafts, implants, needles, guide wires, and drug delivery devices. Some specific examples of catheters are guide catheters, balloon catheters, tumor ablation catheters, aneurysm catheters, urology catheters, and perfusion catheters. Some examples of grafts include vascular grafts and stent grafts. Some examples of implants are those commonly used in surgical procedures, for example, screws, valves, and clamps, and those that may include a bulking agent or embolic material.

Figure 3A:
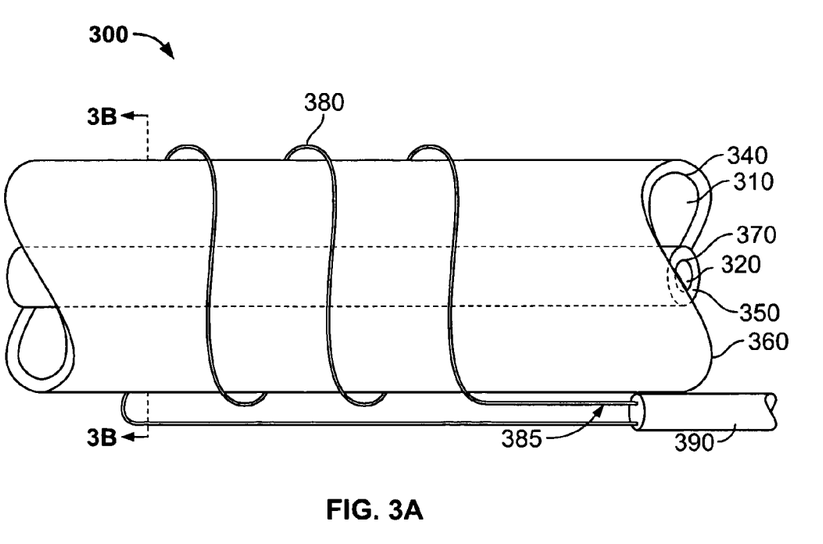
FIG. 3A is a perspective view of a medical device having a coating that includes an imaging material.
Figure 3B:
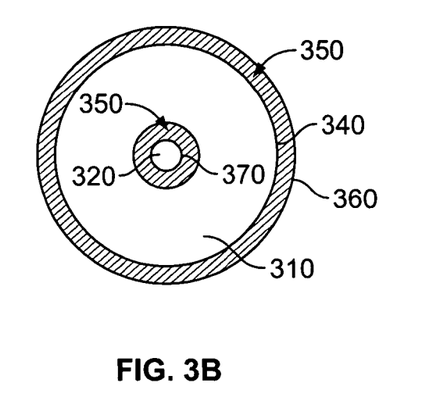
FIG. 3B is cross-sectional view of the medical device of FIG. 3A.

FIGS. 3A and 3B show an example of a medical device 300 having a suitable imaging material incorporated therein that includes the selected MRI detectable nuclei. The medical device 300 shown in this example has an elongate body 310 with a lumen 320 extending longitudinally therethrough. An exterior surface 340 of the elongate body 310 is covered with a coating 350 that includes an imaging material 360. Also in this example, the elongate body 310 has an interior surface 370 which is also coated with the coating 350 that includes the imaging material 360. As an alternative to the example shown in FIGS. 3A and 3B, the coating 350 may be put only on the external surface 340 (or a portion of such surface) or only on the interior surface 370 (or a portion of such surface). Placement of the imaging material 360 within, or on the inside of, the body 310 may have certain advantages. For example, during use of the device 300, there generally may be less fluid exchange in the inner lumen of the device body than on the external surface of body. Losses of imaging material 360 from the coating 350 may be less in the case of placement of imaging material 360 within, or on the inside of, the device body 310 and may therefore enhance longevity of the magnetic resonance visibility effects.

The medical device 300 shown in FIGS. 3A and 3B may be made of one or more materials, such as non-magnetically active materials, that do not interfere with the MRI visibility of the medical device 300. The material can be visibly transparent or opaque. The elongate body 310 of the device 300 may be constructed using a variety of materials suited to the particular type of medical device. Polymers are examples of materials that are suitable for use in magnetic resonance applications. Many polymers may be suitable, such as the following: polycarboxylic acid polymers and copolymers including polyacrylic acids; acetal polymers and copolymers; acrylate and methacrylate polymers and copolymers (e.g., n-butyl methacrylate); cellulosic polymers and copolymers, including cellulose acetates, cellulose nitrates, cellulose propionates, cellulose acetate butyrates, cellophanes, rayons, rayon triacetates, and cellulose ethers such as carboxymethyl celluloses and hydoxyalkyl celluloses; polyoxymethylene polymers and copolymers; polyimide polymers and copolymers such as polyether block imides, polyamidimides, polyesterimides, and polyetherimides; polysulfone polymers and copolymers including polyarylsulfones and polyethersulfones; polyamide polymers and copolymers including nylon 6,6, nylon 12, polycaprolactams and polyacrylamides; resins including alkyd resins, phenolic resins, urea resins, melamine resins, epoxy resins, allyl resins and epoxide resins; polycarbonates; polyacrylonitriles; polyvinylpyrrolidones (cross-linked and otherwise); polymers and copolymers of vinyl monomers including polyvinyl alcohols, polyvinyl halides such as polyvinyl chlorides, ethylene-vinylacetate copolymers (EVA), polyvinylidene chlorides, polyvinyl ethers such as polyvinyl methyl ethers, polystyrenes, styrene-maleic anhydride copolymers, styrene-butadiene copolymers, styrene-ethylene-butylene copolymers (e.g., a polystyrene-polyethylene/butylene-polystyrene (SEBS) copolymer, available as Kraton® G series polymers), styrene-isoprene copolymers (e.g., polystyrene-polyisoprene-polystyrene), acrylonitrile-styrene copolymers, acrylonitrile-butadiene-styrene copolymers, styrene-butadiene copolymers and styrene-isobutylene copolymers (e.g., polyisobutylene-polystyrene block copolymers such as SIBS), polyvinyl ketones, polyvinylcarbazoles, and polyvinyl esters such as polyvinyl acetates; polybenzimidazoles; ionomers; polyalkyl oxide polymers and copolymers including polyethylene oxides (PEO); glycosaminoglycans; polyesters including polyethylene terephthalates and aliphatic polyesters such as polymers and copolymers of lactide (which includes lactic acid as well as d-,l- and meso lactide), epsilon-caprolactone, glycolide (including glycolic acid), hydroxybutyrate, hydroxyvalerate, para-dioxanone, trimethylene carbonate (and its alkyl derivatives), 1,4-dioxepan-2-one, 1,5-dioxepan-2-one, and 6,6-dimethyl-1,4-dioxan-2-one (a copolymer of polylactic acid and polycaprolactone is one specific example); polyether polymers and copolymers including polyarylethers such as polyphenylene ethers, polyether ketones, polyether ether ketones; polyphenylene sulfides; polyisocyanates; polyolefin polymers and copolymers, including polyalkylenes such as polypropylenes, polyethylenes (low and high density, low and high molecular weight), polybutylenes (such as polybut-1-ene and polyisobutylene), polyolefin elastomers (e.g., santoprene), ethylene propylene diene monomer (EPDM) rubbers, poly-4-methyl-pen-1-enes, ethylene-alpha-olefin copolymers, ethylene-methyl methacrylate copolymers and ethylene-vinyl acetate copolymers; fluorinated polymers and copolymers, including polytetrafluoroethylenes (PTFE), poly(tetrafluoroethylene-co-hexafluoropropene) (FEP), modified ethylene-tetrafluoroethylene copolymers (ETFE), and polyvinylidene fluorides (PVDF); silicone polymers and copolymers; polyurethanes; p-xylylene polymers; polyiminocarbonates; copoly(ether-esters) such as polyethylene oxide-polylactic acid copolymers; polyphosphazines; polyalkylene oxalates; polyoxaamides and polyoxaesters (including those containing amines and/or amido groups); polyorthoesters; biopolymers, such as polypeptides, proteins, polysaccharides and fatty acids (and esters thereof), including fibrin, fibrinogen, collagen, elastin, chitosan, gelatin, starch, glycosaminoglycans such as hyaluronic acid; as well as blends and copolymers of the above.

Other materials of which the elongate body 310 may be constructed include ceramics, glass, and non-magnetic metals, such as aluminum and titanium. The material can be radiopaque, for example, visible by X-ray fluoroscopy. Examples of radiopaque materials include tantalum, tungsten, platinum, palladium, or their alloys.

Generally, a suitable imaging material 360 is a material that may be directly imaged in the presence of surrounding body tissue using standard MR imaging techniques. In order to directly detect the medical device that incorporates an imaging material, the imaging material includes one or more selected magnetically active nuclei that, under the same magnetic field, have a resonance (that is, Larmor) frequency that is distinct from the resonance frequency of the protons in the body tissue. Suitable elements having magnetically active nuclei are preferably non-ferromagnetic and non-paramagnetic. Suitable magnetically active nuclei also preferably have a high natural abundance and low intrinsic concentration in the body. Furthermore, it is desirable that the magnetically active nuclei have a high intrinsic sensitivity relative to $^1H$ and a gyromagnetic ratio close to $^1H$ so as to make observation of the agent compatible with existing MR imaging instruments. Other desirable properties of the imaging material are that it be non-radioactive, non-toxic, biochemically inert, and have negligible systemic effects when introduced in the body.

Suitable imaging materials incorporated into the medical device may also include one or more $^1H$ nuclei that are chemically shifted from protons in the body tissue. An example of such a suitable proton-containing imaging material is acetic acid. In addition, suitable magnetically active nuclei of the imaging material should possess spin-lattice ($T_1$) and spin-spin ($T_2$) relaxation times that permit rapid imaging with good sensitivity. A suitable imaging material generally includes one or more magnetically active nuclei having a $T_1$ that is short enough to provide rapid recovery of the longitudinal magnetization. Spin-spin relaxation times of suitable magnetically active nuclei are typically greater than about 1 millisecond.

Relaxation times of the magnetically active nuclei of suitable imaging materials are modulated by the mobility of the imaging material. For example, an imaging material that can freely rotate, or is highly mobile, during imaging generally will increase the $T_2$ and decrease the $T_1$ relaxation times of the magnetically active nuclei. In order to enhance the mobility of the imaging material, the material typically is in the form of, for example, a neat liquid, solution, hydrogel, or an emulsion. In one example, a liquid imaging material is encapsulated, for example in a microsphere, in order to isolate it from the surrounding body fluids and/or device material. Methods for preparing encapsulated liquids are described, for example, by Webb, A. G., et al. in Journal of Magnetic Resonance Imaging (1996), 6(4), pp. 675-683. In medical devices that include a coating that includes the imaging material, the coating may be provided in a hydrated form (for example, in a hydrogel) or in a non-hydrated, or dry, state. Once hydrated (for example, by contact with body fluids or prior to insertion into the body), the coating becomes sufficiently mobile.

Suitable imaging materials may include two or more magnetically equivalent nuclei, which, due to spectral overlap, results in a high apparent concentration of the magnetically active nuclei. Magnetic equivalence also minimizes scalar coupling effects and reduces undesirable artifacts in the MR image associated with the presence of multiple chemical shifts. Also, suitable imaging materials may include one or more half-integer (e.g., spin ½), non-quadrupolar nuclei, such as fluorine ($^{19}F$), phosphorus ($^{31}P$), tritium ($^{3}H$); however, imaging materials having naturally occurring isotopes of nuclei with higher order spin states (e.g., spin 3/2), such as sodium ($^{23}Na$) also can be used. Suitable imaging materials may also include, for example, a fluorinated compound having one or more nuclei with a relatively long $T_2$ value. In one example, the fluorinated compound includes two or more magnetically equivalent $^{19}F$ nuclei, and preferably is perfluorinated. Fluoropolymers, such as poly(tetrafluoroethylene) (PTFE) and fluoroethylene propylene (FEP) polymers, which are often used in the construction of medical devices (for example, shaft materials) are not sufficiently mobile for detection by conventional MRI procedures and will not typically interfere with imaging fluorinated contrast agents.

Some examples of perfluorinated compounds that are suitable for use as imaging material for $^{19}F$ MRI processes include perfluoroalkanes, perfluoroalkylamines, perfluorocrown-ethers, perfluorinated alcohols, perfluorohaloalkanes, perfluorinated carboxylic acids, perfluorinated acrylates, and perfluorinated esters. Some examples of perfluoroalkanes are perfluorodecalin and perfluorononane. An example of a perfluoro-crown-ether is perfluoro-[15]-crown-5-ether. Other fluorinated compounds include 4-fluoro-dl-glutamic acid and fluorinated polysaccharides, such as, fluorinate alginate.

A medical device may include multiple different kinds of imaging materials or contrast agents, which each may be visualized using different types of imaging procedures (for example, MRI, X-ray, and ultrasound). The medical device may also include more than one MRI imaging material, as well and one or more radiopaque materials and/or ultrasound imaging materials. The ultrasound imaging material may be any material that enhances visibility during ultrasound imaging. An ultrasound imaging material may include, for example, a suspension having trapped bubbles of sufficient size to deflect sound waves. Any of the medical devices described above can include an MRI imaging material, a radiopaque material, and/or an ultrasound imaging material, in any combination or arrangement.

The imaging material may be combined with a material having a $T_1$ relaxation time that is different than that of the medical device and/or tissue. For example, the imaging material may include a liquid, such as a solution having a $T_1$ (longitudinal) relaxation time shortening agent and a proton-containing fluid, such as water or glycerin. Examples of $T_1$ relaxation time shortening agents include a paramagnetic metal salt or a paramagnetic metal chelate compound, such as heavy metal complexes, for example, gadolinium diethylenetriamine-pentaacetic acid (for example, a 1% Gd-DTPA aqueous solution), GdDTPA-BMA, and GdHP-D03A (available from Schering, Nycomed and Bracco under the trade name MAGNEVIST, OMNISCAN, and PROHANCE). Alternatively or in addition, the imaging material may include a material having a $T_2$ relaxation time that is different than that of the medical device and/or tissue. For example, the imaging material may include carrier or a fluid having ferromagnetic or superparamagnetic nanoparticles, such as iron oxide, dysprosium oxide, and/or gadolinium oxide. The particles can be surface modified, for example, made hydrophilic, to suspend the particles in the fluid and reduce the occurrence of precipitation and/or coagulation. In certain embodiments, a relaxation agent may be used with the imaging material to decrease the spin-lattice ($T_1$) and/or the $T_2$ relaxation time of the imaging material and/or the surrounding body tissue. For example, in a device that includes an imaging material in multiple members within the device, selected members can include $T_1$ relaxation time shortening agents, while different selected members can include $T_2$ relaxation time shortening agents.

Imaging material 360 may be incorporated into the coating 350 using standard methods, such as compounding or blending. The coating 350 can be, for example, a conventional medical device coating, such as a lubricous, hydrophilic and/or hydrogel coating, that is routinely used to improve biocompatibility and to aid in insertion of the device through the body tissue. Hydrophilic and hydrogel polymers that are commonly used to coat medical devices include, for example, polyethylene oxide, polypropylene oxide, polyvinyl-pyrrolidone, polyurethane-polyurea, polycarboxylic acid, cellulosic polymers, gelatin, maleic anhydride polymers, polyamides, polysaccharides, polyvinyl alcohol, polyacrylic acid, hyaluronic acid polymers, collagen polymers, and poly(2-hydroxyethyl methacrylate) (polyHEMA). In some examples, the coating 350 may include a hydrophobic polymer, for example, to protect portions of the device from contact with aqueous media and/or body fluids. Alternatively, the coating 350 with the imaging material can be applied directly to the surface of the device either as a neat material or in the presence of solvent.

The coating 350 also can include a releasable therapeutic agent or a pharmaceutically active compound, such as, for example, antithrombogenic agents, antioxidants, anti-inflammatory agents, anesthetic agents, anti-coagulants, and antibiotics. Additional examples of possible agents and compounds include the following: (a) Ca-channel blockers including benzothiazapines such as diltiazem and clentiazem, dihydropyridines such as nifedipine, amlodipine and nicardapine, and phenylalkylamines such as verapamil, (b) serotonin pathway modulators including: 5-HT antagonists such as ketanserin and naftidrofuryl, as well as 5-HT uptake inhibitors such as fluoxetine, (c) cyclic nucleotide pathway agents including phosphodiesterase inhibitors such as cilostazole and dipyridamole, adenylate/Guanylate cyclase stimulants such as forskolin, as well as adenosine analogs, (d) catecholamine modulators including α-antagonists such as prazosin and bunazosine, β-antagonists such as propranolol and α/β-antagonists such as labetalol and carvedilol, (e) endothelin receptor antagonists, (f) nitric oxide donors/releasing molecules including organic nitrates/nitrites such as nitroglycerin, isosorbide dinitrate and amyl nitrite, inorganic nitroso compounds such as sodium nitroprusside, sydnonimines such as molsidomine and linsidomine, nonoates such as diazenium diolates and NO adducts of alkanediamines, S-nitroso compounds including low molecular weight compounds (e.g., S-nitroso derivatives of captopril, glutathione and N-acetyl penicillamine) and high molecular weight compounds (e.g., S-nitroso derivatives of proteins, peptides, oligosaccharides, polysaccharides, synthetic polymers/oligomers and natural polymers/oligomers), as well as C-nitroso-compounds, O-nitroso-compounds, N-nitroso-compounds and L-arginine, (g) ACE inhibitors such as cilazapril, fosinopril and enalapril, (h) ATII-receptor antagonists such as saralasin and losartin, (i) platelet adhesion inhibitors such as albumin and polyethylene oxide, (j) platelet aggregation inhibitors including aspirin and thienopyridine (ticlopidine, clopidogrel) and GP IIb/IIIa inhibitors such as abciximab, epitifibatide and tirofiban, (k) coagulation pathway modulators including heparinoids such as heparin, low molecular weight heparin, dextran sulfate and β-cyclodextrin tetradecasulfate, thrombin inhibitors such as hirudin, hirulog, PPACK(D-phe-L-propyl-L-arg-chloromethylketone) and argatroban, FXa inhibitors such as antistatin and TAP (tick anticoagulant peptide), Vitamin K inhibitors such as warfarin, as well as activated protein C, (l) cyclooxygenase pathway inhibitors such as aspirin, ibuprofen, flurbiprofen, indomethacin and sulfinpyrazone, (m) natural and synthetic corticosteroids such as dexamethasone, prednisolone, methprednisolone and hydrocortisone, (n) lipoxygenase pathway inhibitors such as nordihydroguairetic acid and caffeic acid, (o) leukotriene receptor antagonists, (p) antagonists of E- and P-selectins, (q) inhibitors of VCAM-1 and ICAM-1 interactions, (r) prostaglandins and analogs thereof including prostaglandins such as PGE1 and PGI2 and prostacyclin analogs such as ciprostene, epoprostenol, carbacyclin, iloprost and beraprost, (s) macrophage activation preventers including bisphosphonates, (t) HMG-CoA reductase inhibitors such as lovastatin, pravastatin, fluvastatin, simvastatin and cerivastatin, (u) fish oils and omega-3-fatty acids, (v) free-radical scavengers/antioxidants such as probucol, vitamins C and E, ebselen, trans-retinoic acid and SOD mimics, (w) agents affecting various growth factors including FGF pathway agents such as bFGF antibodies and chimeric fusion proteins, PDGF receptor antagonists such as trapidil, IGF pathway agents including somatostatin analogs such as angiopeptin and ocreotide, TGF-β pathway agents such as polyanionic agents (heparin, fucoidin), decorin, and TGF-β antibodies, EGF pathway agents such as EGF antibodies, receptor antagonists and chimeric fusion proteins, TNF-α pathway agents such as thalidomide and analogs thereof, Thromboxane A2 (TXA2) pathway modulators such as sulotroban, vapiprost, dazoxiben and ridogrel, as well as protein tyrosine kinase inhibitors such as tyrphostin, genistein and quinoxaline derivatives, (x) MMP pathway inhibitors such as marimastat, ilomastat and metastat, (y) cell motility inhibitors such as cytochalasin B, (z) antiproliferative/antineoplastic agents including antimetabolites such as perinea analogs (e.g., 6-mercaptopurine or cladribine, which is a chlorinated purine nucleoside analog), pyrimidine analogs (e.g., cytarabine and 5-fluorouracil) and methotrexate, nitrogen mustards, alkyl sulfonates, ethylenimines, antibiotics (e.g., daunorubicin, doxorubicin), nitrosoureas, cisplatin, agents affecting microtubule dynamics (e.g., vinblastine, vincristine, colchicine, paclitaxel and epothilone), caspase activators, proteasome inhibitors, angiogenesis inhibitors (e.g., endostatin, angiostatin and squalamine), rapamycin, cerivastatin, flavopiridol and suramin, (aa) matrix deposition/organization pathway inhibitors such as halofuginone or other quinazolinone derivatives and tranilast, (bb) endothelialization facilitators such as VEGF and RGD peptide, and (cc) blood rheology modulators such as pentoxifylline.

Methods for applying coatings to medical devices are well known in the art and include, for example, dip coating and spraying. In some embodiments, the coating material includes a hydrophilic (for example, hydrogel) material that is dried after application to remove water or solvent to improve storage stability. Upon exposure to saline solution or other aqueous media before clinical use, the hydrophilic surface coating is fully regenerated to its original state. Hydrophilic and/or hydrophobic polymers can be integrated or attached to the device 300 utilizing an extrusion process. For example, the polymer and/or imaging material 360 can be applied to device 300 through co-extrusion with a structural material. The structural polymer provides desirable mechanical properties while the polymer provides magnetic resonance contrast and the desired surface treatment (for example, lubricity). The polymer can be compounded or blended with a structural polymer and/or the imaging material 360. The compounded or blended polymers can be applied to device 300 to provide a material having structurally beneficial properties and magnetic resonance contrast. In addition, the surface of the medical device may be pre-treated in order to affix the coating to the surface of the device and/or enhance the hydrophilicity of plastic substrates prior to coating. Conventional surface treatment techniques include, for example, plasma activation, silanization, and treating the surface with a primer solution.

Chemical and/or physical cross-linking of the coating 350 may be desired, depending on the type of coating, to prevent the coating from sloughing off or leaching from the surface of the device during insertion and/or contact with the surrounding body fluids. Cross-linking can be achieved, for example, by using standard chemical or radiation-based (for example, photochemical and electron beam) techniques.

Referring again to the device 300 shown in FIGS. 3A and 3B, an imaging sensor 380, shown as a coil, optionally, can be mounted to the device's elongate body 310 in order to detect the signal emitted from the device directly. The imaging sensor 380 can be, for example, a coil, loop, monopole antenna, dipole antenna, imaging helix, or loosely coupled profiling coil. The imaging sensor 380 can be connected to a power source (not shown) by electrical leads 385 that are coupled to a coaxial cable 390.

Figure 4A:
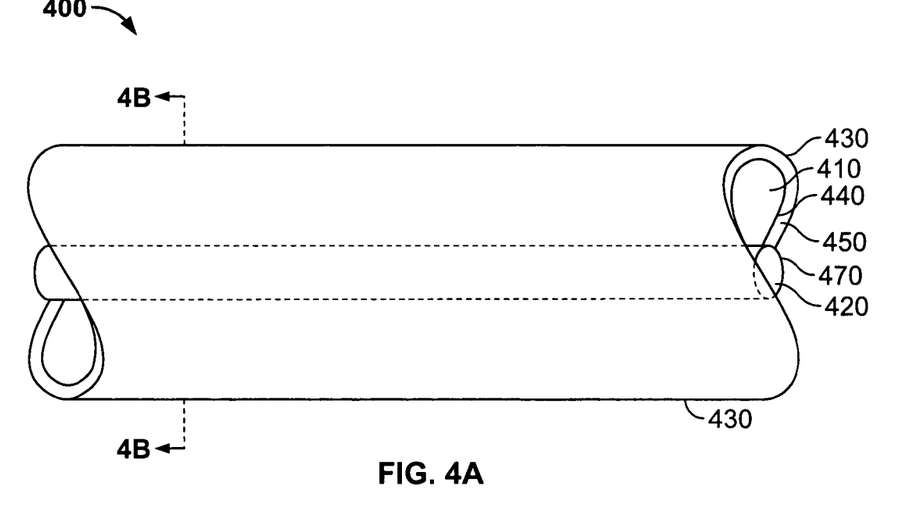
FIG. 4A is a perspective view of a medical device having a film layer that includes an imaging material.
Figure 4B:
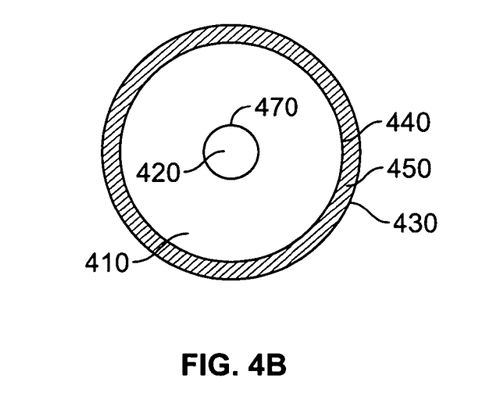
FIG. 4B is a cross-sectional view of the medical device of FIG. 4A.

FIGS. 4A and 4B show another example of a medical device 400 having a suitable imaging material incorporated therein that includes the MRI detectable nuclei. In this example, the medical device 400 has an imaging material that resides within a porous material in the device. The medical device 400 has an elongate body 410 that has a lumen 420 extending longitudinally therethrough. The device 400 includes a layer of porous material 430 on an exterior surface 440 of the elongate body 410. The layer of porous material 430, in this example, is a film. The porous material 430 includes an imaging material 450 that resides within the pores 460 of the porous material. Although not included in the example device 400 shown in FIGS. 4A and 4B, the porous material 430 that incorporates the imaging material may also, or alternatively, reside on an interior surface 470 of the device's elongate body 410. In other types of devices, the porous material incorporating the imaging material may be included as a discrete layer within a multilayer construction. The porous material 430 also may be incorporated into the structural material of the device, for example, by co-extruding the material with the structural material using methods that are known to those skilled in the art. Average pore size for the porous material 430 may, for example, be in the range of about 0.2 to 3 microns. In some examples, the pore size may be as large as 100 microns, but in most examples, it will be preferred that pore size be less than 50 microns. Porous materials having pore sizes with the above size dimensions are frequently referred to as "microporous" materials. Microporous materials include, for example, microporous films and foams. In other examples, nanoporous structures may be used that have a pore size of less than 0.2 microns.

Porous films may be made from a variety of different polymeric materials, including, for example, poly(tetrafluoroethylene), polyolefins, such as, for example, poly(propylene) and poly(ethylene), fluoroethylene propylene, polyurethane, polysulfone, polyester, polyamide, cellulosic polymers, silicones, Ethylene-Propylene-Nonconjugated Diene (EPDM) rubbers, Styrene-Isobutylene-Styrene (SIBS), polyamides, or poly(2-hydroxyethyl methacrylate). In addition, the film may include a hydrogel polymer.

Generally, the type of porous material that is used may be determined by the physical and chemical properties of the imaging material. For example, microporous films and expanded microporous films that are made of a hydrophobic material (e.g., poly(tetrafluoroethylene)) are particularly suited for retaining hydrophobic contrast agents within the pores. In other examples, other of the previously listed example polymer materials may be used. Various expanded poly(tetrafluoroethylene) (ePTFE) fibers, films and tubes can be purchased from Zeus Industrial Products of Orangeburg, S.C.; International Polymer Engineering of Tempe, Ariz.; and W.L. Gore & Associates, Inc. of Elkton, Md. One way that the pores of the porous material 430 may be impregnated with an imaging material 450 is to soak the porous material 430 in a liquid imaging agent. Mechanical agitation (e.g., shaking or sonication) may be used to accelerate the impregnation process.

Figure 5A:
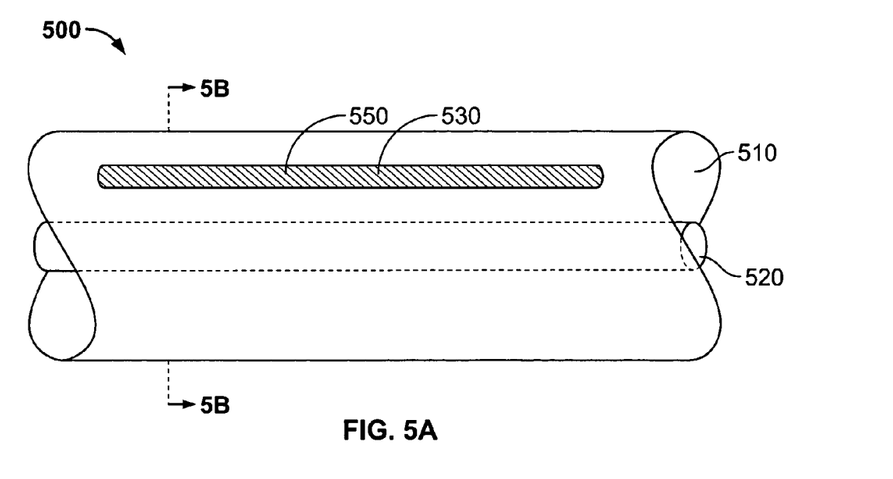
FIG. 5A is a perspective view of a medical device having a reservoir filled with an imaging material.
Figure 5B:
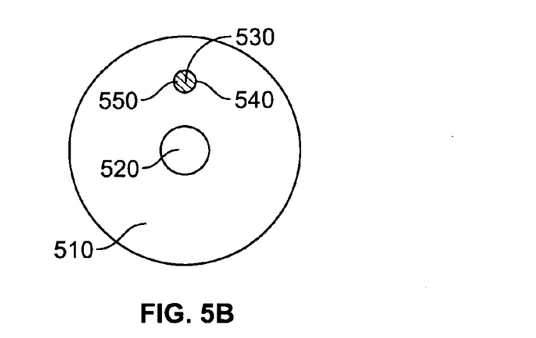
FIG. 5B is a cross-sectional view of the medical device of FIG. 5A.

FIGS. 5A and 5B show yet another example of a portion of a medical device 500 (in this example, a catheter) that has a suitable imaging material incorporated therein. The medical device 500 includes an elongate body 510 that has a lumen 520 extending longitudinally therethrough. In this example, an imaging material 530 is encapsulated within the device body 510, and more particularly, within an internal cavity 550 formed within the device's elongate body 510. A member 540 is located within the internal cavity 550 and incorporates therein the imaging material 530. The member 540 fills the entire volume of the cavity 550. The cavity 550 and encapsulated member 540 contained therein, in this example, is long and narrow, and the length extends parallel to the longitudinal axis of the elongate body 530. As such, it is possible to ascertain not only the location of the medical device, but also its spatial orientation. In other embodiments, the member may be of any suitable size and shape, and may be positioned within an existing lumen of a medical device, within a hollow fiber that resides within a medical device, or within channels or cavities carved into walls of a medical device body. The imaging material member 540 may alternatively reside between, or within, one or more structural materials or layers of a device or device component. The member 540 may also be sealed, or closed, to form the cavity 550. In some embodiments, the device 500 includes multiple members 540.

The particular dimensions and/or configuration of the member 540 may be a function of the device in which the member is used and/or the desired MRI visibility. Generally, the member 540 may have a variety of different configurations or shapes that may be recognized in the MRI image. Also, the member 540 may have a cross section that is circular or non-circular, such as oval, or regularly or irregularly polygonal having three or more sides. The member 540 may be substantially elongated and relatively flexible. The outer surface of the member 540 may be relatively smooth, for example, cylindrical or rod-like, or faceted. The member 540 may have uniform or non-uniform thickness; for example, the member may be tapered in thickness along its length. Different combinations of members 540 having two or more different configurations or shapes may be used in various medical devices. Also, different arrangements of members 540 are possible. For example, an elongated member 540 may extend substantially an entire length of a medical device. Alternatively or in addition, members 540 having similar or different dimensions may extend at selected portion(s) of the device. Any number members can be included in a medical device.

The imaging material 530 may be introduced into member 540 by, for example, injection, and then sealed (for example, by closing a valve leading to the reservoir) to prevent leakage of the imaging material 530 out of the member 540. By encapsulating the imaging material 530 within the member 540 of the device body 510, the position of the imaging material 530 is known and isolated from other portions of the medical device 500 and from the surrounding body fluids.

The member 540 may be made of a material that has a low permeability or is impermeable to fluids, for example, water or solvent, that are present in the imaging material. The low permeability to fluids reduces or prevents fluids from exiting the member 540 and reduces the visibility of the imaging material. Examples of materials that are suitable for the member 540 include polymers such as polypropylene, polyethylene, polysulfonate, polyamide (nylon), polyethyleneterephthalate (PET), poly(tetrafluoroethylene) and polyacetonitrile. In addition, various barrier polymers may be suitable, such as isobutylene, polyvinylidene fluoride, etc. Additional suitable barrier polymer materials are known to those of skill in the art. For example, a list of barrier polymer materials may be found in *Kirk-Othmer Encyclopedia of Chemical Technology*, $5^{th}$ ed., 1994. Other materials include glass, non-magnetic metals such as aluminum and titanium, and radiopaque materials such as those described above.

The method used to form the member 540 depends on the materials in the member 540. In some embodiments, where the member 540 is formed separately from the device body 510, the member 540 can be formed using conventional techniques, for example, extrusion, drawing, or casting. The member 540 may be loaded with the imaging material 530 by injecting the imaging material into the member 540, or alternatively by soaking the member 540 in the imaging material 530. The member 540 may be sealed by heating (for example, by melting), gluing, and/or mechanically working (for example, crimping) the member. Methods of incorporating the member 540 into a medical device depend on the type of device. In some embodiments, a member 540, such as a relatively long polymer member, may be co-extruded with the device, such as a catheter, according to conventional techniques. Members 540 may be in fiber form, and the fibers may be mixed with a polymer of a device prior to extrusion or forming. The fibers may be randomly oriented, or preferentially oriented. Injection molding techniques may be used to form the members 540. For example, the members 540 may be placed in a cavity of a mold, and material(s) of a device can be injected into the mold to form the device, such as a tube. In other embodiments, the members 540 can be mixed with a device material and injected into the mold.

Figure 6:
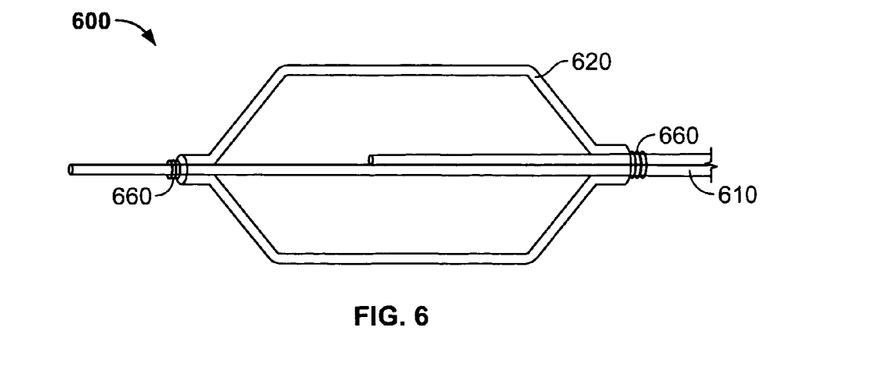
FIG. 6 is a perspective view of a balloon catheter that includes an imaging material incorporated therein.

FIG. 6 shows yet another example of a medical device 600 having a suitable imaging material incorporated therein that includes the MRI detectable nuclei. In this example, the medical device 600 is a balloon catheter. The catheter 600 has an elongate body 610 and a balloon 620 that that is disposed about the elongate body 610. The elongate body 610 may include one or more members 540 of the type described in connection with FIGS. 5A and 5B. As described, an imaging material is incorporated into the one or more members 540, and hence may be incorporated into the balloon catheter 600 as shown in FIG. 6. Alternatively or in addition, the balloon 620 may include a suitable imaging material to enhance the balloon's MRI visibility. For example, a suitable imaging material may be compounded with a polymer and extruded to form a tube that may be formed into a balloon. Alternatively or in addition, the balloon catheter 600 may include MRI visible markers 660 at selected portions, as shown, at the proximal and distal ends of the balloon 620. The markers 660, for example, can indicate the location of the balloon 620 when it is inflated to a recommended inflation volume. As shown, the markers 660 are elongated members wound around selected portions of catheter's elongate body 610.

The medical devices described above may each be inserted into a patient's body and detected by MRI to obtain a combined image of the device and of the body tissue in the vicinity of the device. The devices that incorporate imaging materials as described above enable physicians to perform procedures under an open MRI system, instead of under X-ray. Because the MRI signal from the imaging material may be detected independently from the signal generated by the body tissue, the progress of the device may be tracked within the body in real-time during an interventional or intravascular procedure. The progress of the device may be monitored as it is guided through the vascular system to ensure that the device is delivered properly to a target site. Once delivered to the target site, the device can be monitored to determine whether it has been placed properly and/or is functioning properly.

EXAMPLES OF IMMOBILIZING FLUORINATED COMPOUNDS (FLUORO-COMPOUNDS) ON DEVICE SURFACES TO PROVIDE MRI IMAGES

In the case of a fluorinated compound that is attached onto a device surface, it is well known for the people in the art to employ various immobilizing techniques, such as grafting polymerization, chemical coupling through a primer, covalently linking through functionizing surface, etc. In the examples provided below, a primer is used to immobilize the fluorinated compounds onto the surface. The type of primer selected depends on the chemical nature of the fluorinated compounds. In principle, the primer should contain a reactive group to react with the fluorinated compounds. A few examples are provided for illustration use.

Preparation of Primer Solution

The primer solution prepared in the following procedures is used to immobilize the organic acid containing fluorinated compounds:

A primer solution is prepared by adding 980 g of BAYHYDROL PR240 (40% by weight, solvent-free anionic aliphatic polyurethane dispersion in water (pH 6.5-7.5 at 25° C.) available from Bayer AG) and 20 g NEOCRYL CX-100 (a polyfunctional aziridine crosslinking agent available from NeoResin of Wilmington, Mass.) to a glass beaker and thoroughly stirring the mixture. Ammonium hydroxide is slowly added to the solution to adjust the pH to about 8-8.5. Bayhydrol PR240 is a solvent-free anionic aliphatic polyurethane dispersion in water. It has a solids content of approximately 40 wt % and a pH of 6.5-7.5 at 25° C. NeoCryl CX-100 is a polyfunctional aziridine crosslinking agent.

Preparation of 4-fluoro-dl-glutamic Acid (FGA) Coating Solution

A 1% by weight solution of a sodium acrylate and acrylamide copolymer is prepared by slowly adding 10 g GLASCOL WN 33 (available from Allied Colloids) to a beaker containing 839 g distilled water while continuously stirring the solution. The beaker is covered with parafilm, and the solution is stirred for 6-15 hours until the copolymer is fully dissolved in the water. 150 g 4-fluoro-dl-glutamic acid is added slowly into the GLASCOL WN 33 solution with stirring. The solution is then adjusted to a pH of about 9 with ammonium hydroxide. The beaker is covered with parafilm and the solution is stirred continuously for 6-15 hours. Once the GLASCOL WN 33 and the FGA are thoroughly dissolved, 1 g of sodium chloride is added to the solution.

Preparation of Fluorinate Alginate (FA) Coating Solution 30 g of fluorinated alginate is added with agitation into a glass beaker containing 970 g of water. A viscous solution with a viscosity of 200-400 cps is obtained after about 12 hours of agitation. The pH of the solution is adjusted to about 9 with ammonium hydroxide.

Immobilization of Fluoro-Compounds on a Device

DEVICE A: FGA can be immobilized onto a polyetheramide catheter according to the following procedure. A 6F catheter (available from Scimed Life Systems, Inc., Maple Grove, Minn.) is cleaned with isopropanol. A TEFLON coated stainless steel mandrel of a proper size is inserted into the lumen to keep the catheter straight. The catheter is dipped into the primer solution and air dried for about 10 minutes. The catheter is then dipped into the FGA solution and air dried for about 15 minutes, dipped into the FGA solution again, and air dried for about 15 minutes. The air-dried catheter is placed in a 140° F. oven for post curing for about 8-24 hours.

DEVICE B: FA can be immobilized onto a polyethylene 3F microcatheter (available from Scimed Life Systems, Inc., Maple Grove, Minn.) according to the procedure described in Device A.

A number of embodiments of the invention have been described. Nevertheless, it will be understood that various modifications may be made without departing from the spirit and scope of the invention.

What is claimed is:

1. A method of generating an MRI image of a medical device and proximate body tissue in which the device is located, wherein the medical device has incorporated therein an imaging material comprising selected MRI detectable nuclei, wherein the medical device further comprises a receiver coil, the method comprising:

performing a first MRI process on a body portion including at least a portion of the medical device to obtain first image data, wherein the first MRI process is adapted to detect MRI detectable nuclei present in the proximate body tissue by using an RF antenna external to the body portion;

performing a second MRI process on the body portion to obtain second image data, wherein the second MRI process is adapted to detect the selected MRI detectable nuclei contained in the medical device imaging material and the selected MRI detectable nuclei is not the same nuclei that the first MRI process is adapted to detect, wherein the receiver coil provides MRI enhancement by detecting a signal emitted from the MRI detectable nuclei contained in the medical device; and combining the second image data with the first image data to produce combined image data for the medical device and the proximate body tissue, and that indicates the relative position of the medical device within the proximate body tissue.

2. The method of claim 1 wherein the first MRI process is a hydrogen nuclei MRI process.

3. The method of claim 2 wherein the second MRI process is a fluorine nuclei MRI process and the imaging material incorporated into the medical device includes fluorine nuclei.

4. The method of claim 2 wherein the second MRI process is a phosphate nuclei MRI process and the imaging material incorporated into the medical device includes phosphate nuclei.

5. The method of claim 2 wherein the second MRI process is an iodine nuclei MRI process and the imaging material incorporated into the medical device includes iodine nuclei.

6. The method of claim 5 wherein the iodine nuclei are in the form of an iodine-polymer complex.

7. The method of claim 1 wherein the first MRI process is a phosphor nuclei MRI process.

8. The method of claim 1 wherein the first MRI process is a potassium nuclei MRI process.

9. The method of claim 1 wherein the first MRI process is a sodium nuclei MRI process.

10. The method of claim 1 wherein the second MRI process is a fluorine nuclei MRI process and the imaging material incorporated into the medical device includes fluorine nuclei.

11. The method of claim 10, wherein the agent comprises a perfluorinated compound selected from the group consisting of perfluoroalkanes, perfluoroalkylamines, perfluoro-crown-ethers, perfluorinated alcohols, perfluorohaloalkanes, perfluorinated carboxylic acids, perfluorinated acrylates, and perfluorinated esters.

12. The method of claim 10, wherein the imaging material comprises a perfluoroalkane selected from the group consisting of perfluorodecalin, perfluorononane, and combinations thereof.

13. The method of claim 10, wherein the imaging material comprises perfluoro-[15]-crown-5-ether.

14. The method of claim 10, wherein the imaging material comprises 4-fluoro-dl-glutamic acid.

15. The method of claim 10, wherein the imaging material comprises fluorinate alginate.

16. The method of claim 1 wherein the second MRI process is a phosphate nuclei MRI process and the imaging material incorporated into the medical device includes phosphate nuclei.

17. The method of claim 1 wherein the second MRI process is an iodine nuclei MRI process and the imaging material incorporated into the medical device includes iodine nuclei.

18. The method of claim 17 wherein the iodine nuclei are in the form of an iodine-polymer complex.

19. The method of claim 1 wherein the first MRI process uses a first frequency of transmitted radio frequency excitation pulses that is different from a second frequency of transmitted radio frequency excitation pulses used in the second MRI process.

20. The method of claim 1 wherein the first MRI process and the second MRI process use the same frequency for transmitted radio frequency excitation pulses, and wherein the first MRI process uses a first magnetic field strength that is different from a second magnetic field strength used in the second MRI process.

21. The method of claim 1 wherein the first and second MRI processes are performed during a common time period using a time-sharing technique that interleaves transmitted MRI excitation pulses used in each of the first and second MRI processes.

22. The method of claim 1 wherein the first and second MRI processes are performed at different times.

23. The method of claim 1 wherein multiple, successive samples of the combined image data are generated during the course of an intervention procedure.

24. The method of claim 23 wherein the method further comprising generating on a display device multiple, successive images of the multiple, successive samples of the combined image data as the combined image data samples are being generated.

25. The method of claim 1 wherein the method further comprises generating on a display device an image of the combined image data.

26. The method of claim 1, wherein the medical device is selected from the group consisting of catheters, grafts, implants, needles, and guide wires.

27. The method of claim 1, wherein the medical device is a catheter selected from the group consisting of guide catheters, balloon catheters, tumor ablation catheters, aneurysm catheters, urology catheters, and perfusion catheters.

28. The method of claim 1, wherein the medical device is a graft selected from the group consisting of vascular grafts and stent grafts.

29. The method of claim 1, wherein the medical device is an implant comprising a bulking agent.

30. The method of claim 1, wherein the imaging material is a liquid.

31. The method of claim 30, wherein the liquid is selected from the group consisting of a neat liquid, a solution, or an emulsion.

32. The method of claim 30, wherein the liquid is encapsulated.

33. The method of claim 32, wherein the liquid is encapsulated in a microsphere.

34. The method of claim 32, wherein the liquid is encapsulated in a lumen, a hollow fiber, a microporous material, a channel, or a cavity.

35. The method of claim 32, wherein the liquid is encapsulated in a microporous material.

36. The method of claim 35, wherein the microporous material comprises a microporous polymer.

37. The method of claim 36, wherein the microporous polymer comprises a polymer selected from the group consisting of polytetrafluoroethylene, polypropylene, polyethylene, polyurethane, EPDM rubbers, SIBS, polyamides, and combinations thereof.

38. The method of claim 35 wherein the microporous material comprises a film or a foam.

39. The method of claim 1, wherein the medical device comprises a structural material that includes the imaging material.

40. The method of claim 1, wherein the device comprises a coating that includes the imaging material.

41. The method of claim 40, wherein the coating comprises a hydrogel.

42. The method of claim 41, wherein the coating comprises a polymer selected from the group consisting of polyethylene oxide, polypropylene oxide, polyvinyl-pyrrolidone, polyurethane-polyurea, polycarboxylic acid, cellulosic polymers, gelatin, maleic anhydride polymers, polyamides, polysaccharides, polyvinyl alcohol, polyacrylic acid, and combinations thereof.

43. The method of claim 1, wherein the imaging material comprises a spin ½ nucleus.

44. The method of claim 1, wherein the imaging material comprises at least two spin ½ nuclei that are magnetically equivalent.

45. The method of claim 1, wherein the imaging material comprises an element selected from the group consisting of fluorine, phosphorus, hydrogen, sodium, and tritium.

46. The method of claim 1, wherein the imaging material comprises a hydrogen-containing compound selected from the group consisting of acetic acid.

47. The method of claim 1, wherein the device further comprises a relaxation agent that decreases the spin-lattice relaxation time of the selected MRI detectable nuclei contained in the medical device imaging material.

48. A method of generating an MRI image of a medical device and proximate body tissue in which the device is located, wherein the medical device has incorporated therein an imaging material comprising selected MRI detectable nuclei, the method comprising:

performing a first MRI process on a body portion including at least a portion of the medical device to obtain first image data, wherein the first MRI process is adapted to detect MRI detectable nuclei present in the proximate body tissue;

performing a second MRI process on a body portion to obtain second image data, wherein the second MRI process is adapted to detect the selected MRI detectable nuclei contained in the medical device imaging material and the selected MRI detectable nuclei is not the same nuclei that the first MRI process is adapted to detect, wherein the first MRI process and the second MRI process use the same frequency for transmitted radio frequency excitation pulses, and wherein the first MRI process uses a first magnetic field strength that is different from a second magnetic field strength used in the second MRI process; and combining the second image data with the first image data to produce combined image data for the medical device and the proximate body tissue, and that indicates the relative position of the medical device within the proximate body tissue.

49. A method of generating an MRI image of a medical device and proximate body tissue in which the device is located, wherein the medical device has incorporated therein an imaging material comprising selected MRI detectable nuclei, the method comprising:

performing a first MRI process on a body portion including at least a portion of the medical device to obtain first image data, wherein the first MRI process is adapted to detect MRI detectable nuclei present in the proximate body tissue;

performing a second MRI process on a body portion to obtain second image data, wherein the second MRI process is adapted to detect the selected MRI detectable nuclei contained in the medical device imaging material and the selected MRI detectable nuclei is not the same nuclei that the first MRI process is adapted to detect, wherein the second MRI process is a fluorine nuclei MRI process and the imaging material incorporated into the medical device includes fluorine nuclei, wherein the imaging material comprises perluoro-[15]-crown-5-ether; and combining the second image data with the first image data to produce combined image data for the medical device and the proximate body tissue, and that indicates the relative position of the medical device within the proximate body tissue.

* * * * *